(12) United States Patent
Reznicek et al.

(10) Patent No.: US 11,121,174 B2
(45) Date of Patent: Sep. 14, 2021

(54) MRAM INTEGRATION INTO THE MOL FOR FAST 1T1M CELLS

(71) Applicant: International Business Machines Corporation, Armonk, NY (US)

(72) Inventors: Alexander Reznicek, Troy, NY (US); Michael Rizzolo, Delmar, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/690,675

(22) Filed: Nov. 21, 2019

(65) Prior Publication Data

US 2021/0159270 A1 May 27, 2021

(51) Int. Cl.
*H01L 27/22* (2006.01)
*H01L 43/12* (2006.01)
*H01L 43/02* (2006.01)

(52) U.S. Cl.
CPC ............ *H01L 27/228* (2013.01); *H01L 43/02* (2013.01); *H01L 43/12* (2013.01)

(58) Field of Classification Search
CPC ........ H01L 27/228; H01L 43/02; H01L 43/12
USPC ...................................................... 257/252
See application file for complete search history.

(56) References Cited

U.S. PATENT DOCUMENTS

| | | | |
|---|---|---|---|
| 6,879,516 B2 | 4/2005 | Nejad et al. | |
| 7,002,825 B2 | 2/2006 | Scheuerlein | |
| 7,095,069 B2 | 8/2006 | Cha | |
| 7,440,339 B2 | 10/2008 | Nejad et al. | |
| 8,634,234 B2 | 1/2014 | Keshtbod et al. | |
| 8,913,423 B2 | 12/2014 | Lee et al. | |
| 9,548,096 B1 | 1/2017 | Li et al. | |
| 10,797,224 B2 * | 10/2020 | Raghavan | G11C 5/06 |
| 2003/0214839 A1 | 11/2003 | Jang et al. | |
| 2004/0108561 A1 | 6/2004 | Jeong | |
| 2007/0230242 A1 | 10/2007 | Lee et al. | |
| 2009/0085121 A1 * | 4/2009 | Park | H01L 27/228 |
| | | | 257/368 |
| 2012/0193752 A1 | 8/2012 | Purushothaman et al. | |

(Continued)

FOREIGN PATENT DOCUMENTS

| CN | 103094283 A | 5/2013 |
|---|---|---|
| CN | 109216466 A | 1/2019 |

(Continued)

OTHER PUBLICATIONS

International Search Report dated Jan. 27, 2021 received in International Application No. PCT/IB2020/059976, 10 pages.

*Primary Examiner* — Tu-To V Ho
(74) *Attorney, Agent, or Firm* — Scully, Scott, Murphy & Presser, P.C.; Daniel P. Morris, Esq.

(57) ABSTRACT

A memory cell is provided in which a bottom electrode of a magnetoresistive random access memory (MRAM) device is connected to one of the source/drain contact structures of a transistor, and a lower contact structure is connected to another of the source/drain contact structures of the transistor. In the present application, the MRAM device and the lower contact structure are present in the middle-of-the-line ((MOL) not the back-end-of-the-line (BEOL). Moreover, the bottom electrode of the MRAM device, and a lower portion of the lower contact structure are present in a same dielectric material (i.e., a MOL dielectric material).

18 Claims, 14 Drawing Sheets

(56) References Cited

U.S. PATENT DOCUMENTS

2018/0248111 A1    8/2018  Raghavan et al.
2020/0176041 A1*   6/2020  Shen .................... H01L 27/222
2020/0303623 A1*   9/2020  Wiegand ............. H01L 45/1675

FOREIGN PATENT DOCUMENTS

| DE | 102004039978 B4 | 8/2009 |
|----|----|----|
| WO | 2013103516 A1 | 7/2013 |
| WO | 2018186863 A1 | 10/2018 |

\* cited by examiner

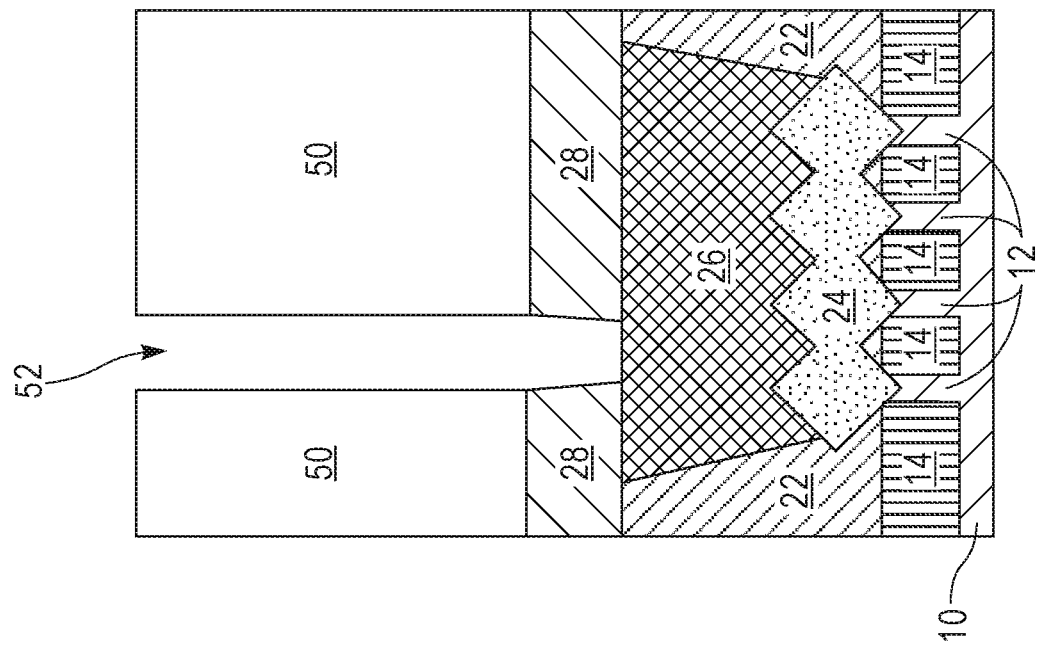
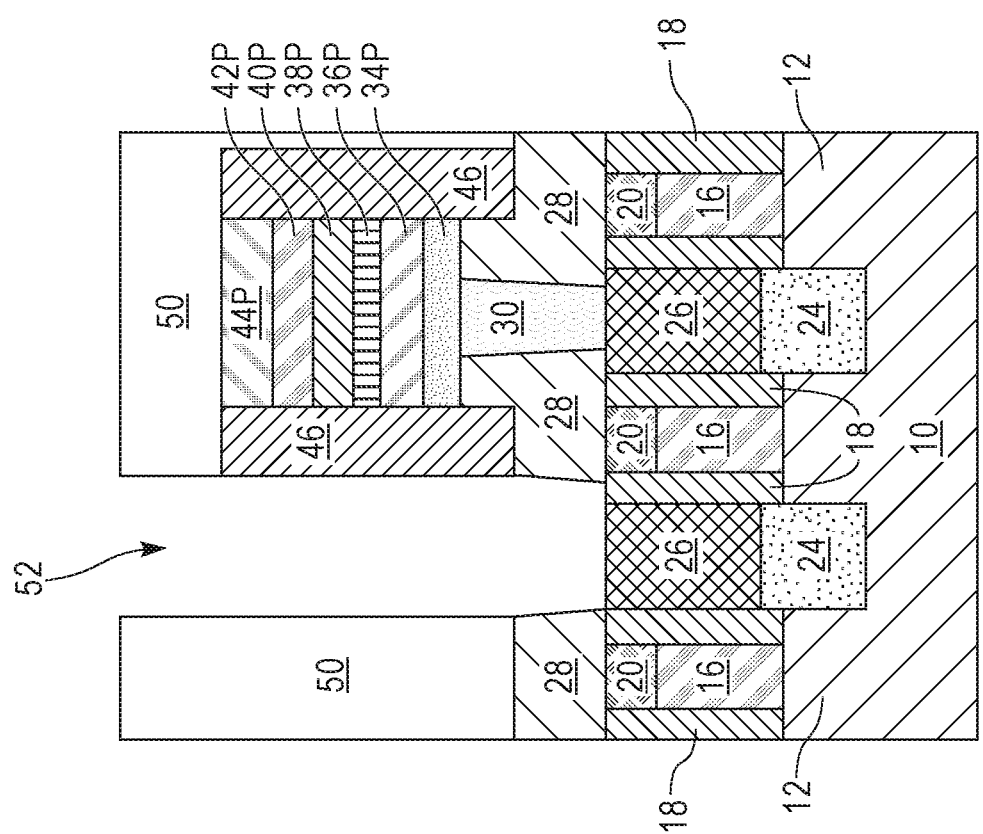

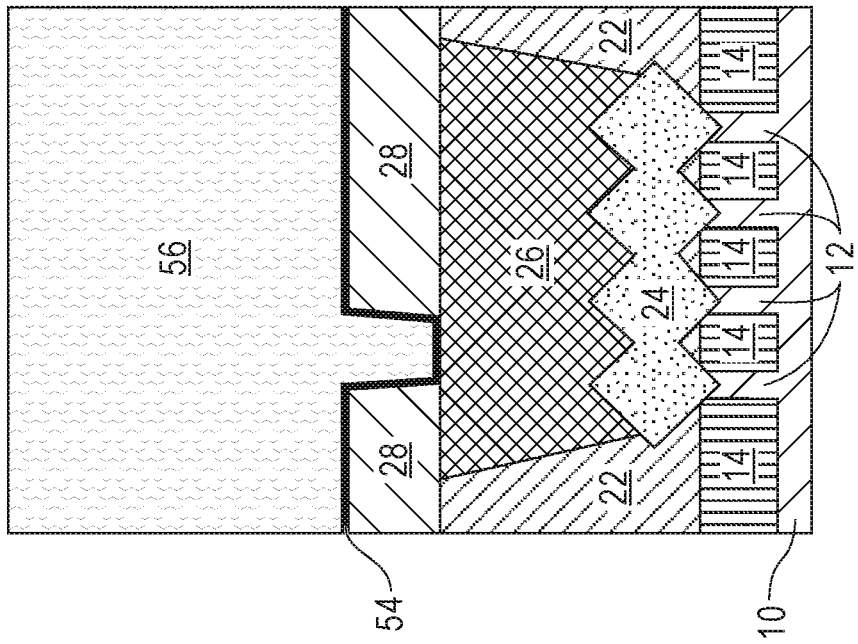
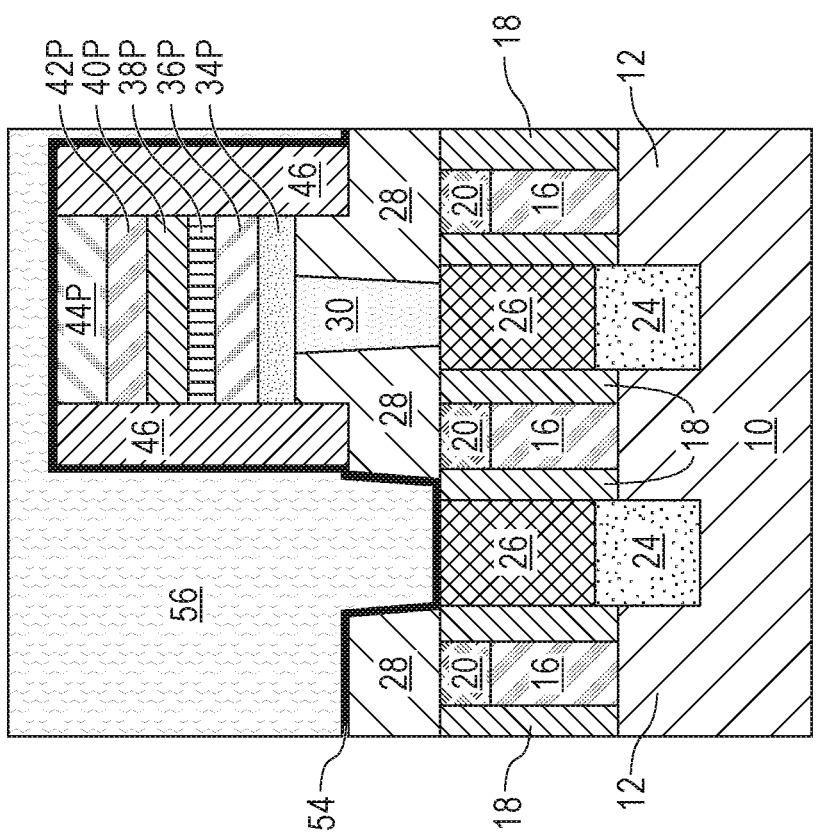

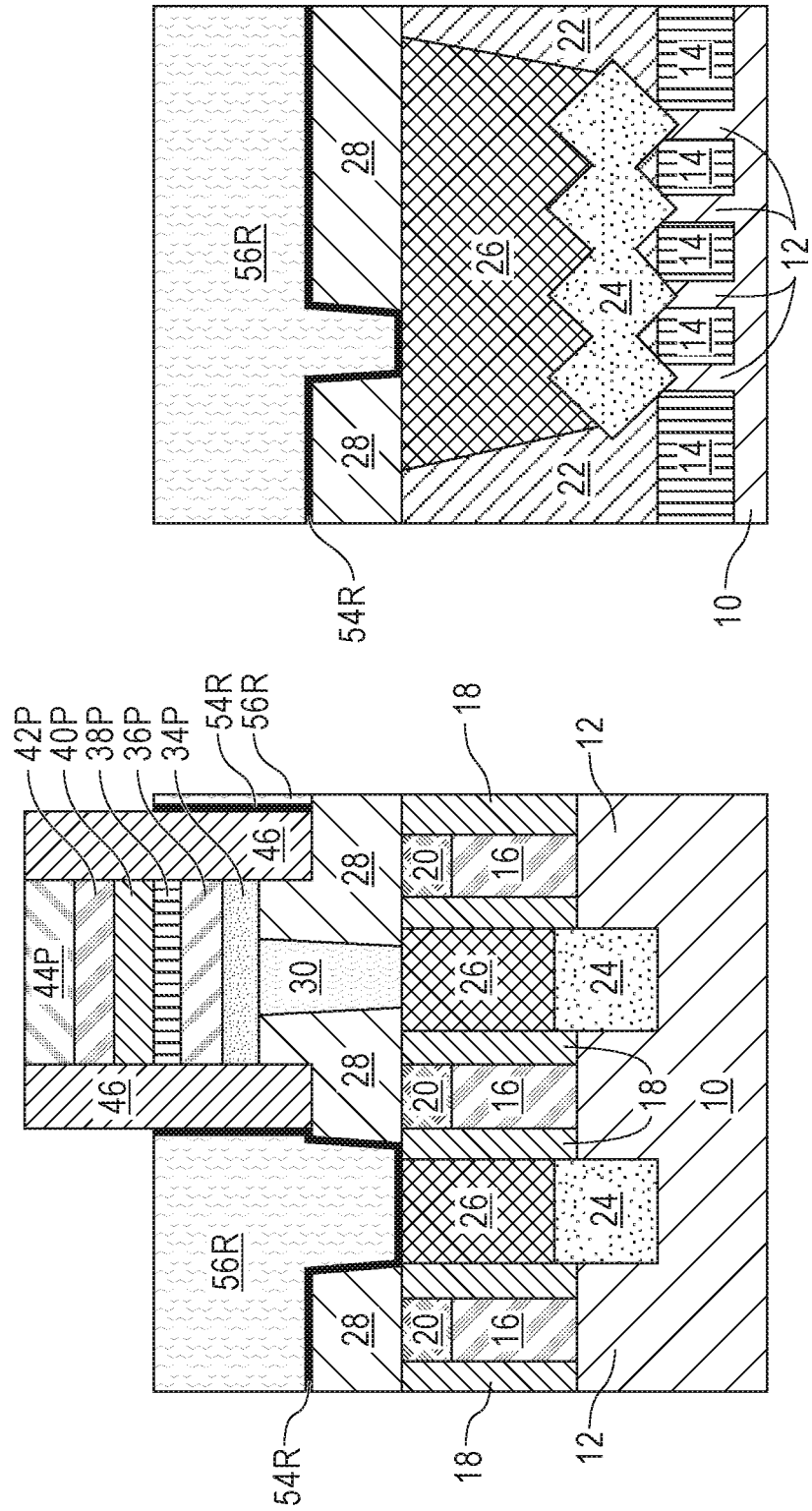

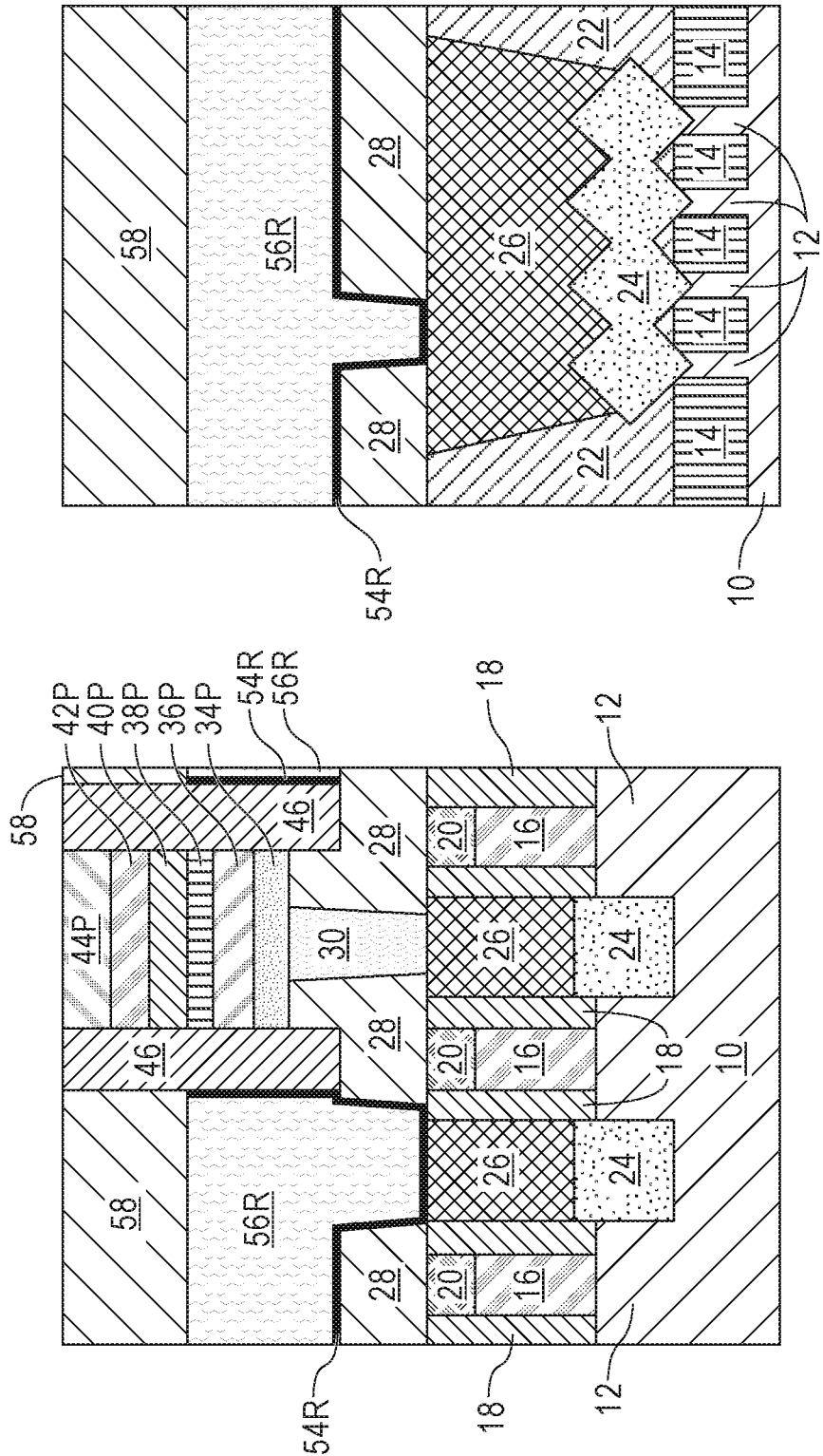

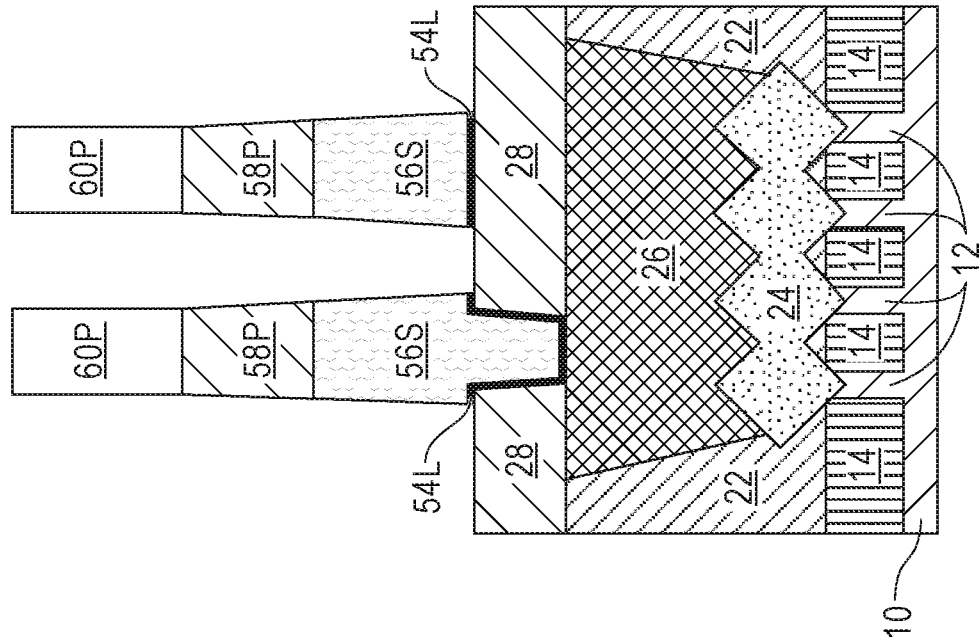
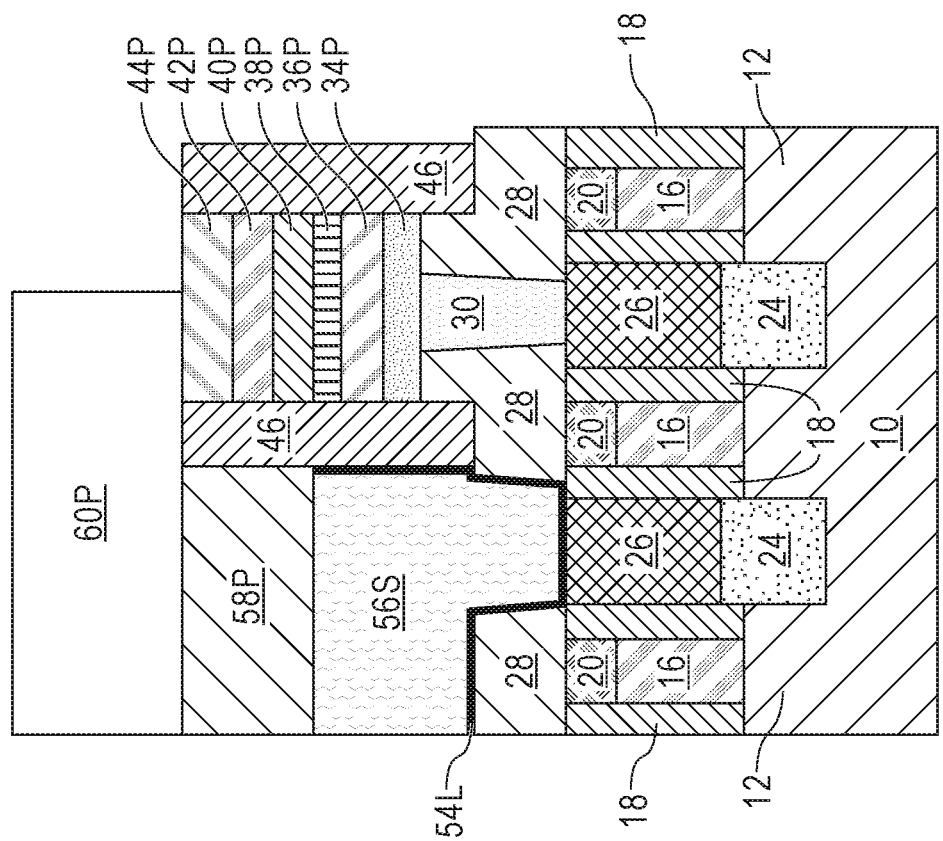
FIG. 11A
FIG. 11B

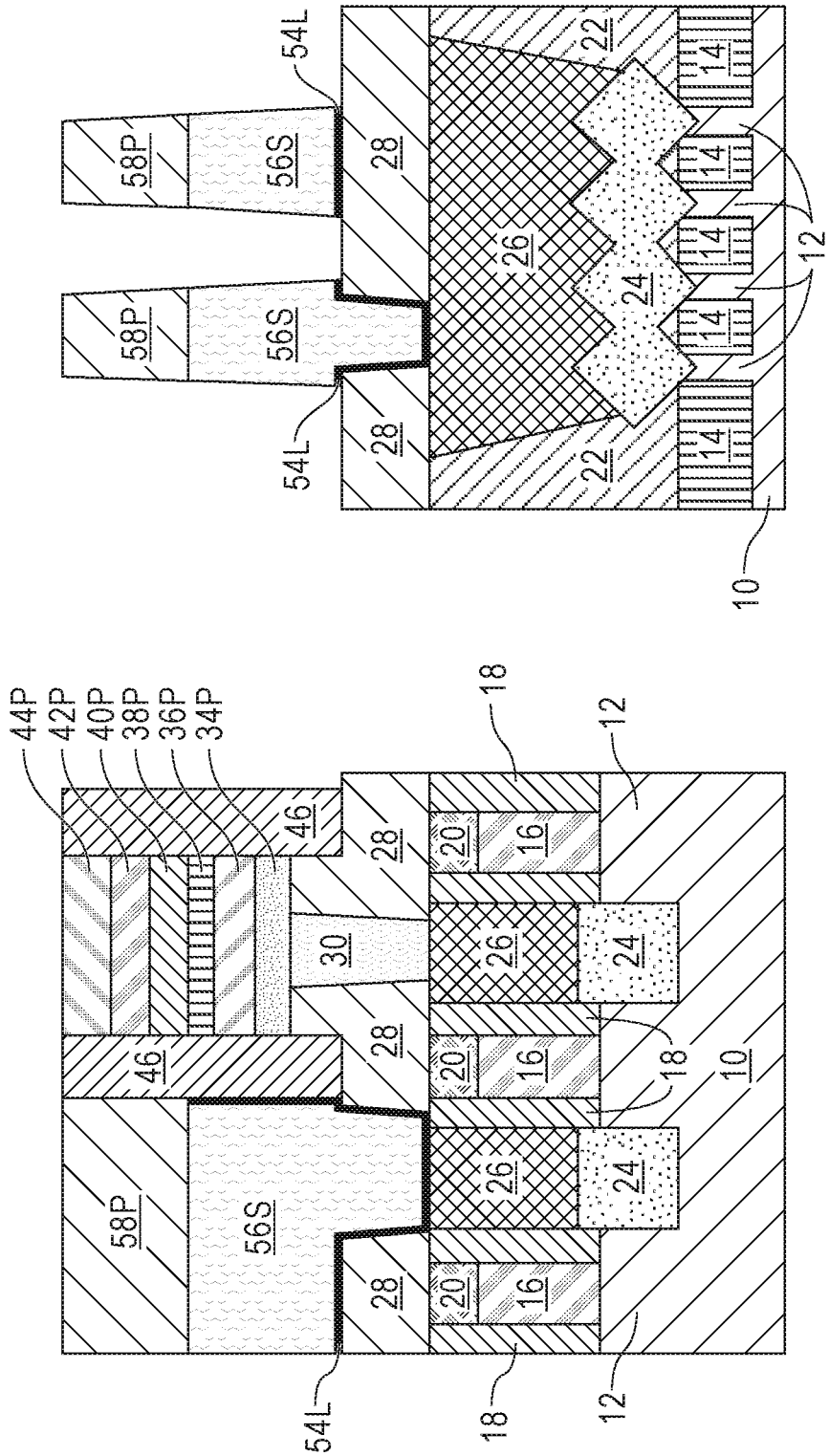

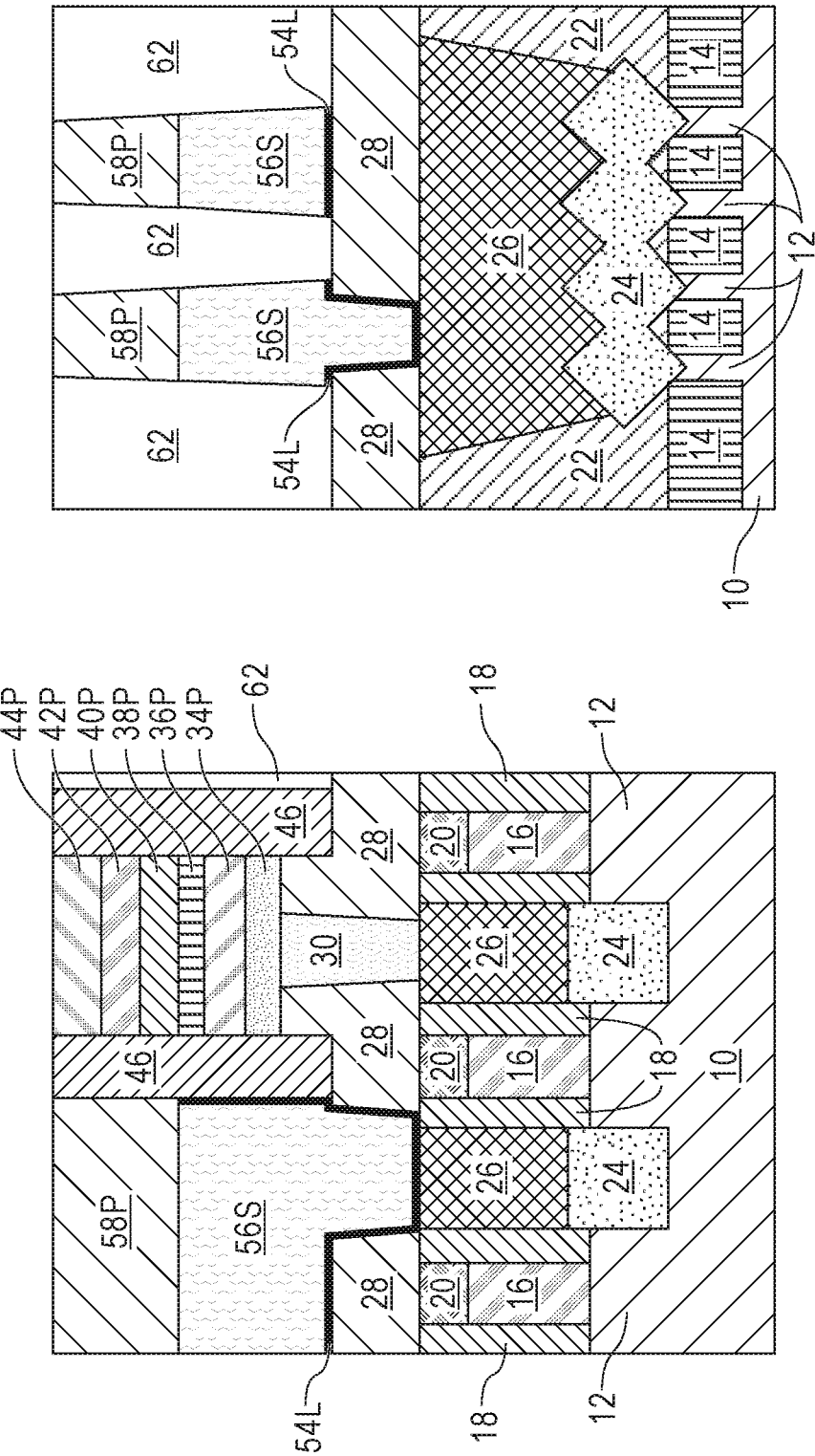

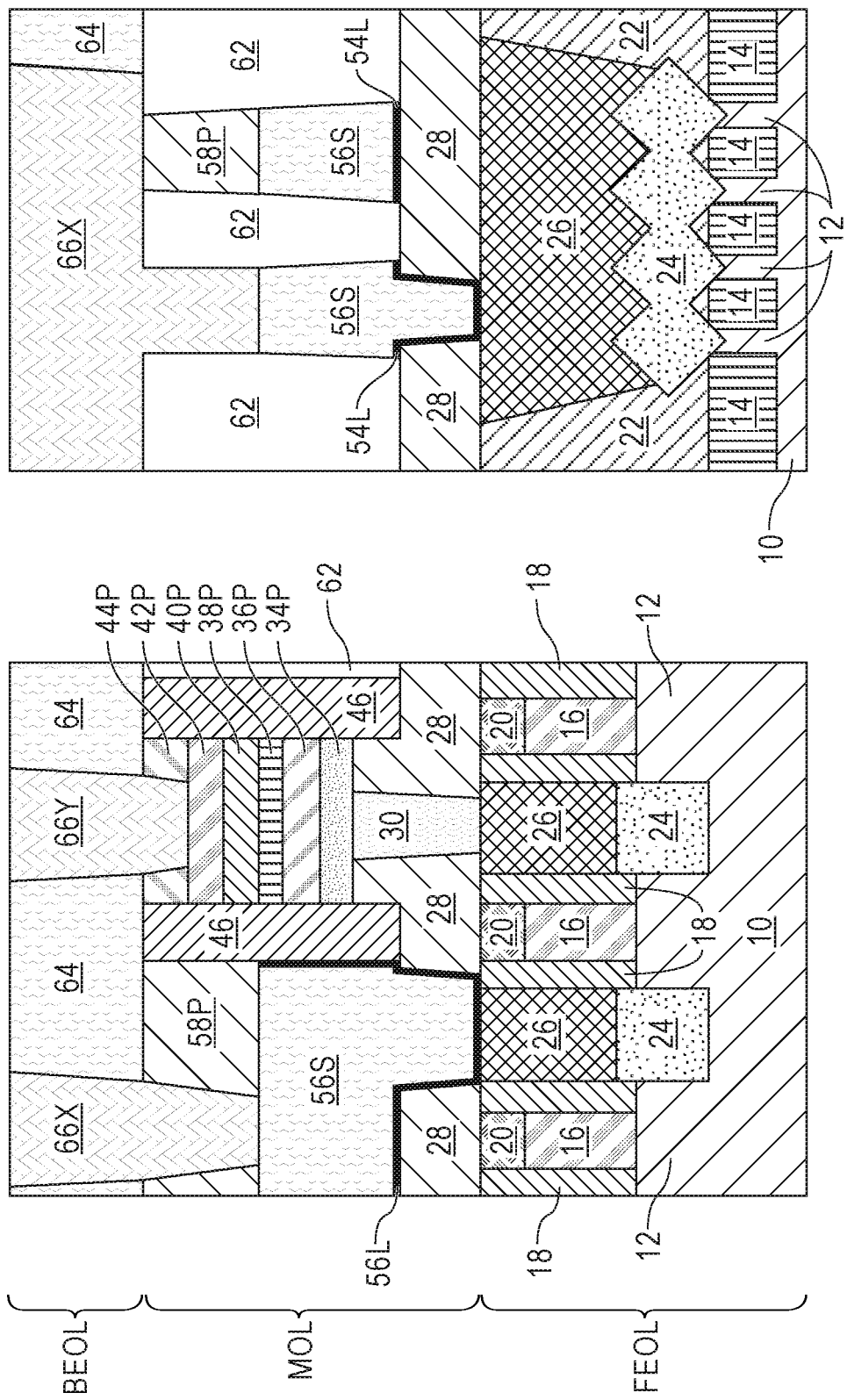

MRAM INTEGRATION INTO THE MOL FOR FAST 1T1M CELLS

BACKGROUND

The present application relates to a memory cell, and more particularly to a memory cell including one transistor (1T) and one magnetoresistive random access memory (MRAM) device as well as a method of making such a cell.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates is a permanent magnetic set to a particular polarity (i.e., a magnetic reference layer); the other plate's magnetization can be changed to match that of an external field to store memory (i.e., a magnetic free layer). Such a configuration is known as a magnetic tunnel junction (MTJ) pillar.

In leading-edge or neuromorphic computing systems, the MRAM device is embedded in the back-end-of-the-line (BEOL) that is located above the front-end-of-the-line (FEOL) that includes one or more transistors. The wiring resistance from the MRAM device that is embedded in the BEOL to the transistor that is present in the FEOL is high. High wiring resistance is not good for memory speed.

There is thus a need to provide a memory cell in which the MRAM device is connected to a transistor in which the wiring resistance is low.

SUMMARY

A memory cell is provided in which a bottom electrode of a MRAM device is connected to one of the source/drain contact structures of a transistor, and a lower contact structure is connected to another of the source/drain contact structures of the transistor. In the present application, the MRAM device and the lower contact structure are present in the MOL not the BEOL as with a typical prior art structure. Moreover, the bottom electrode of the MRAM device, and a lower portion of the lower contact structure are present in a same dielectric material (i.e., a MOL dielectric material).

In one aspect of the present application, a memory cell that has low wiring resistance is provided. In one embodiment of the present application, the memory cell includes a FEOL level that includes a gate structure straddling over a semiconductor fin, wherein a source/drain structure is located on each side of the gate structure, and a source/drain contact structure is located on each source/drain structure. A MOL level is located above the FEOL level and includes a MRAM device and a lower contact structure, wherein a bottom electrode of the MRAM device contacts one of the source/drain contact structures located on one side of the gate structure, and the lower contact structure contacts another of the source/drain contact structures located on another side of the gate structure. A BEOL level is located above the MOL level and includes a first upper contact structure contacting a surface of the lower contact structure, and a second upper contact structure contacting a surface of a top electrode of the MRAM device.

In another aspect of the present application, a method of forming a memory cell having low wiring resistance is provided. In one embodiment, the method includes forming a FEOL level including a gate structure straddling over a semiconductor fin, wherein a source/drain structure is located on each side of the gate structure, and a source/drain contact structure is located on each source/drain structure. Next, a dielectric material layer of a MOL level is formed over the FEOL level. A bottom electrode of a MRAM device is then formed in the dielectric material layer and contacts one of the source/drain contact structures located on one side of the gate structure. Next, a magnetic tunnel junction (MTJ) pillar and a top electrode of the MRAM device are formed above the bottom electrode. A lower contact structure is then formed that contacts another of the source/drain contact structures located on another side of the gate structure, wherein a lower portion of the lower contact structure is embedded in the dielectric material layer. Next, a back-end-of-line (BEOL) level is formed above the MOL level and includes a first upper contact structure contacting a surface of the lower contact structure, and a second upper contact structure contacting a surface of the top electrode of the MRAM device.

BRIEF DESCRIPTION OF THE DRAWINGS

FIG. 6A is an X-X cross sectional view of the exemplary structure of FIG. 5A after forming an organic planarization layer (OPL) that has a contact opening formed therein that physically exposes a surface of another of the source/drain contact structures of the first gate structure.

FIG. 6B is a Y-Y cross sectional view of the exemplary structure shown in FIG. 6A.

FIG. 8A is an X-X cross sectional view of the exemplary structure of FIG. 7A after forming a conductive metal-containing layer and a contact metal-containing layer.

FIG. 8B is a Y-Y cross sectional view of the exemplary structure shown in FIG. 8A.

FIG. 9A is an X-X cross sectional view of the exemplary structure of FIG. 8A after recessing both the contact metal-containing layer and the conductive metal-containing layer.

FIG. 9B is a Y-Y cross sectional view of the exemplary structure shown in FIG. 9A.

FIG. 10A is an X-X cross sectional view of the exemplary structure of FIG. 9A after forming a hard mask cap on the recessed contact metal-containing layer and the recessed conductive metal-containing layer.

FIG. 10B is a Y-Y cross sectional view of the exemplary structure shown in FIG. 10A.

FIG. 11A cross sectional view of the exemplary structure of FIG. 10A after forming another OPL, and then patterning the another OPL, the hard mask, the recessed contact metal-containing layer and the recessed conductive metal-containing layer that are present in the source/drain region.

FIG. 11B is a Y-Y cross sectional view of the exemplary structure shown in FIG. 11A.

FIG. 12A is an X-X cross sectional view of the exemplary structure of FIG. 11A after removing the another OPL.

FIG. 12B is a Y-Y cross sectional view of the exemplary structure shown in FIG. 12A.

FIG. 13A is an X-X cross sectional view of the exemplary structure of FIG. 12A after forming a low-k dielectric fill material, and planarizing the low-dielectric fill material.

FIG. 13B is a Y-Y cross sectional view of the exemplary structure shown in FIG. 13A.

FIG. 14A is an X-X cross sectional view of the exemplary structure of FIG. 13A after forming a BEOL dielectric material layer having upper contact structures formed therein.

FIG. 14B is a Y-Y cross sectional view of the exemplary structure shown in FIG. 14A.

DETAILED DESCRIPTION

Figure 1A:
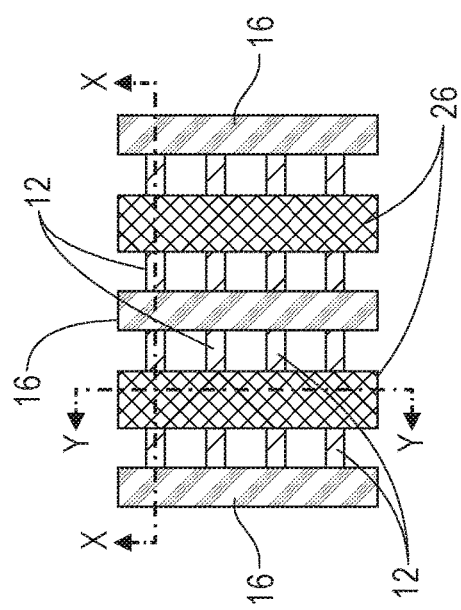
FIG. 1A is a diagram showing the various cross sections that will be illustrated in the present application; X-X is a cross section along a lengthwise direction of a semiconductor fin, and Y-Y is a cross section perpendicular to, and between, a neighboring pair of semiconductor fins and in one of the source/drain regions.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

One solution to the problem mentioned in the background section of this application is to move the MRAM device to the MOL, which is positioned between the FEOL and the BEOL. Such a solution is not easy to achieve and causes different problems than mentioned above. For example, the ion beam etch used to form the MTJ pillar of the MRAM device can damage the gate structure and/or the source/drain contact structure. Also, a thick FEOL dielectric material is typically needed which would significantly increase the height of the source/drain contact structure which, in turn, provides an undesired high source/drain contact resistance. The present application provides a memory cell in which a bottom electrode of a MRAM device is connected to one of the source/drain contact structures of a transistor, and a lower contact structure is connected to another of the source/drain contact structure s of the transistor. In the memory cell of the present application, the MRAM device and the lower contact structure are both present in the MOL. Also and in the memory cell of the present application, the bottom electrode of the MRAM device, and a lower portion of the lower contact structure are present in a same dielectric material (i.e., a MOL dielectric material).

Before describing the present application in detail, reference is first made to FIG. 1A which is a diagram showing the various cross sections that will be illustrated in the present application. In FIG. 1A, element 16 refers to a gate structure, element 12 refers to a semiconductor fin, and element 26 refers to a source/drain contact structure. As is shown, the gate structures 16 are orientated perpendicular to the semiconductor fins 12. Also, and for the middle gate structure 16, a source/drain contact structure 26 is located on each side of that gate structure 16. In FIG. 1A, X-X is a cross section along a lengthwise direction of one of the semiconductor fins 12, and Y-Y is a cross section perpendicular to, and between, a neighboring pair of semiconductor fins and in one of the source/drain regions. As is known to one skilled in the art, a first source/drain region is located on one side (i.e., a first side) of a gate structure, and a second source/drain region is located on another side (i.e., a second side) of a gate structure, wherein the first side is opposite to the second side.

Figure 1C:
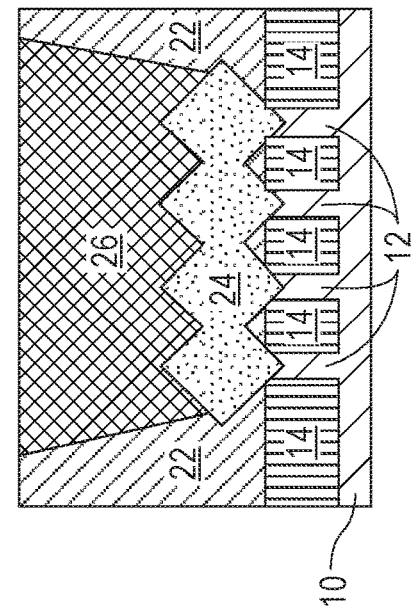
FIG. 1C is a Y-Y cross sectional view of the exemplary structure shown in FIG. 1B.
Figure 1B:
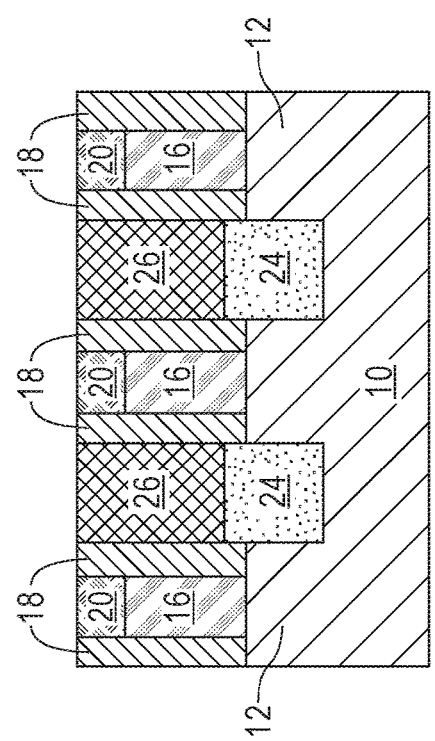
FIG. 1B is an X-X cross sectional view of an exemplary structure that can be employed in one embodiment of the present application, the exemplary structure includes a plurality of semiconductor fins extending upward from a surface of a substrate, a plurality of gate structures oriented perpendicular to, and straddling over a portion of, each semiconductor fin, a source/drain structure located adjacent to each gate structure, and a source/drain contact structure present on each source/drain structure.

Referring now to FIGS. 1B-1C, there are shown an exemplary structure that can be employed in one embodiment of the present application. The exemplary structure shown in FIGS. 1B-1C is present in the FEOL and includes a plurality of semiconductor fins 12 extending upward from a surface of a substrate 10, a plurality of gate structures 16 oriented perpendicular to, and straddling over a portion of, each semiconductor fin 12, a source/drain structure 24 located adjacent to each gate structure 16, and a source/drain contact structure 26 present on each source/drain structure 24.

As is shown in FIG. 1B, a gate cap 20 can be present on each gate structure 16, and a gate spacer 18 can be present on a sidewall of each gate structure 16 and if present, each gate cap 20. As is shown in FIG. 1C, and in some embodiments of the present application, the source/drain structures 24 that are located between each gate structure 16 may be merged. Also, and as shown in FIG. 1C, a trench isolation structure 14 can be present laterally adjacent to each semiconductor fin 12, and a FEOL dielectric material 22 can be located laterally adjacent to the source/drain structures 24, which are merged in the illustrated embodiment, and the source/drain contact structure 26.

The exemplary structure shown in FIGS. 1B-1C can be formed utilizing processes that are well known to those skilled in the art. For example, a gate first process or a gate last process can be used to form the exemplary structure shown in FIGS. 1B-1C. The details concerning the process used to form the exemplary structure shown in FIGS. 1B-1C are not provided in this application so as not to obscure the method of the present application.

In some embodiments of the present application, the substrate 10 can be composed of a semiconductor material that has semiconducting properties. Exemplary semiconductor materials that can be used as the substrate 10 include, but are not limited to, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In other embodiments of the present application, the substrate 10 can be composed of an insulator such as, for example, silicon dioxide or boron nitride. In such an embodiment, a handle substrate (not shown) can be located beneath the insulator that provides substrate 10.

The semiconductor fins 12 are composed of a semiconductor material as defined above for substrate 10. In some embodiments, the semiconductor fins 12 are composed of a compositionally same semiconductor material as substrate 10. In other embodiments, the semiconductor fins 12 are composed of a compositionally different semiconductor material than substrate 10.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 12 has a height from 20 nm to 200 nm, a width from 5 nm to 30 nm, and a length from 20 nm to 50 μm. Other heights and/or widths and/or lengths that are lesser than, or greater than, the ranges mentioned herein can also be used in the present application. Each semiconductor fin 12 is spaced apart from its nearest neighboring semiconductor fin 12 by a pitch of from 20 nm to 100 nm; the pitch is measured from one point of one semiconductor fin to the exact point on a neighboring semiconductor fin. Also, each semiconductor fin 12 is oriented parallel to each other. An opening or gap is present between each neighboring pairs of semiconductor fins 12.

The semiconductor fins 12 can be formed by patterning an upper semiconductor material portion of a base semiconductor substrate. Such patterning may include, for example, lithography and etching, or a sidewall image transfer (SIT) process. The base semiconductor substrate can be a bulk semiconductor substrate (i.e., a substrate composed entirely of at least one semiconductor material) or a semiconductor-on-insulator (SOI) substrate composed of a top semiconductor material layer, an insulator material, and a handle substrate. When an SOI substrate is used as the base semiconductor substrate, the top semiconductor material layer is patterned to provide semiconductor fins 12 which extend upward from the insulator material of the SOI substrate.

Trench isolation structure 14 can be composed of a trench dielectric material such as, for example, silicon dioxide. The trench isolation structure 14 can be formed by depositing a trench dielectric material within the gap that is present between each semiconductor fin 12, and then performing an etch back process on the deposited trench dielectric material. In some embodiments, the formation of the trench isolation structure 14 can be omitted.

Each gate structure 16 includes a gate dielectric material layer, not shown, and a gate conductor layer, also not shown. Each gate structure 16 forms a component of a transistor. In some embodiments, the gate dielectric material layer is positioned entirely beneath the gate conductor layer. In other embodiment, the gate dielectric material layer is present on the sidewalls and a bottom wall of the gate conductor layer.

The gate dielectric material layer may be composed of a gate dielectric material such as, for example, an oxide, nitride, and/or oxynitride. In one example, the gate dielectric material that provides the gate dielectric material layer can be a high-k material having a dielectric constant greater than 4.0; all dielectric constants are measured in a vacuum unless stated to the contrary. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric material layer. The gate dielectric material layer can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material that provides the gate dielectric material layer can have a thickness in a range from 1 nm to 10 nm. Other thicknesses that are lesser than, or greater than, the aforementioned thickness range can also be employed for the gate dielectric material layer.

The gate conductor layer can be composed of a gate conductor material. The gate conductor material used in providing the gate conductor layer can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor layer can be formed by any deposition process including, for example, CVD, PECVD, PVD, sputtering, or ALD. The gate conductor layer can have a thickness from 25 nm to 150 nm; although other thicknesses are possible can be used as the thickness of the gate conductor layer.

When present, gate cap 20 is composed of a cap gate material such as, for example, silicon dioxide, silicon nitride or silicon oxynitride. The gate cap 20 can be formed utilizing a deposition process such as, for example, CVD, PECVD, PVD, sputtering, or ALD. The gate cap 20 can have a thickness from 10 nm to 50 nm; although other thicknesses are possible can be used as the thickness of the gate cap 20.

Gate spacer 18 can be composed of a gate spacer dielectric material such as, for example, silicon dioxide, silicon nitride or silicon oxynitride. The gate spacer 18 can be composed of a gate spacer material that is compositionally the same as, or compositionally different from, the gate cap material that provides the gate cap 20. The gate spacer 18 can be formed by a deposition process, followed by a spacer etch.

The FEOL dielectric material 22 is composed of any dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as the FEOL dielectric material 22. The FEOL dielectric material 22 can be formed utilizing a deposition process including, for example, CVD, PECVD, evaporation or spin-on coating.

The source/drain structures 24 which are epitaxially grown from exposed surfaces of the semiconductor fins 12, are composed of a semiconductor material, as defined above, and a dopant. The semiconductor material that provides the source/drain structures 24 can be compositionally the same as, or compositionally different from, the semiconductor material that provides the semiconductor fins 12. The source/drain structures 24 can have at least one faceted surface.

The dopant which is present in the source/drain structures 24 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment of the present application, the concentration of n-type or p-type dopant within the source/drain structures 24 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

The source/drain contact structures 26 are typically composed of a metal silicide such as, for example, tungsten silicide, nickel silicide or platinum silicide. The metal silicide can be formed utilizing a conventional metal semiconductor alloy forming process. The source/drain contact structures 26 can have a topmost surface that is coplanar with a topmost surface of the FEOL dielectric material 22. In addition to metal silicides, the source/drain contact structures 26 can be composed of a contact metal or a contact metal alloy. Contact metals include copper, aluminum, tungsten, or cobalt. The contact metals or contact metal alloys that provide the source/drain contact structures 26 can be formed a deposition process such as, for example, CVD, PECVD, PVD, sputtering, or plating.

Figure 2A:
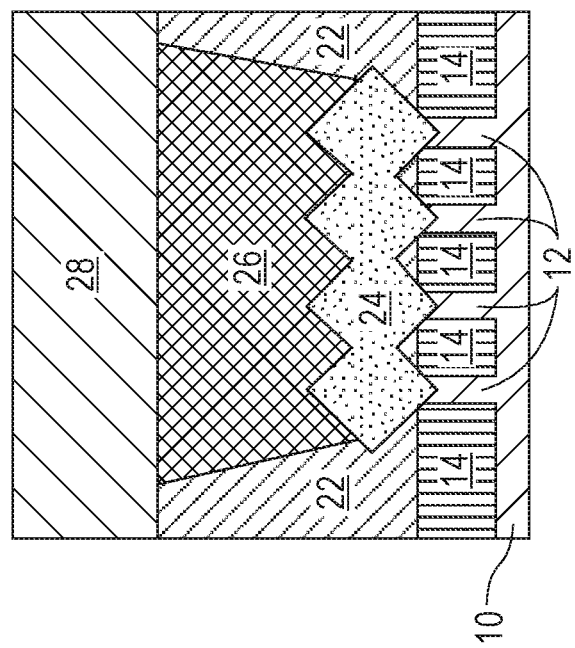
FIG. 2A is an X-X cross sectional view of the exemplary structure of FIG. 1B after forming a bottom electrode that contacts one of the source/drain contact structures of a first gate structure of the plurality of gate structures, wherein the bottom electrode is embedded in a dielectric material layer.
Figure 2B:
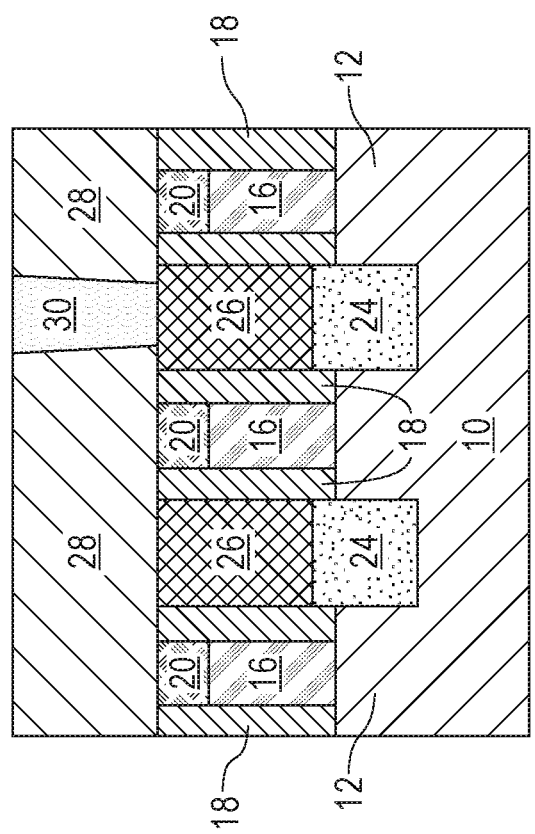
FIG. 2B is a Y-Y cross sectional view of the exemplary structure shown in FIG. 2A.

Referring now to FIGS. 2A-2B, there are shown the exemplary structure of FIGS. 1B-1C after forming a bottom electrode 30 that contacts one of the source/drain contact structures 26 of a first gate structure (i.e., the middle gate structure shown in FIG. 2A) of the plurality of gate structures 16, wherein the bottom electrode 30 is embedded in a dielectric material layer 28. Although the present application describes and illustrates the formation of a single bottom electrode 30, a plurality of bottom electrodes 30 can be formed, each of which contacts one of the source/drain contact structures of a particular gate structure 16.

Dielectric material layer 28 is composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer, as defined above or any combination thereof. In another embodiment, a self-planarizing material such as a spin-on glass (SOG) or a spin-on low-k dielectric material such as SiLK™ can be used as the MOL dielectric material. The use of a self-planarizing dielectric material as the dielectric material layer 28 may avoid the need to perform a subsequent planarizing step. In one embodiment, the dielectric material layer 28 can be formed utilizing a deposition process including, for example, CVD, PECVD, evaporation or spin-on coating. In some embodiments, a planarization process (e.g., chemical mechanical polishing (CMP) or grinding) and/or an etch back process follows the deposition of the dielectric material layer 28. The dielectric material layer 28 may be compositionally the same as, or compositionally different from, FEOL dielectric material 22. The dielectric material layer 28 has a sufficient thickness such that upon subsequent formation of a MTJ pillar no damage to the gate structure 16 and/or the source/drain contact structures 26 occurs. In one example, the dielectric material layer 28 has a thickness from 20 nm to 100 nm.

After forming the dielectric material layer 28, an opening is formed into the dielectric material layer 28 to physically expose a surface of one of the source/drain contact structures 26 of a first gate structure (i.e., the middle gate structure shown in FIG. 2A) of the plurality of gate structures 16. The opening can be formed by lithography and etching. The opening has a critical dimension (CD) that is less than a CD of the underlying source/drain contact structure 26. Moreover, the opening that is formed into the dielectric material layer 28 physically exposes a surface of one of the source/drain contact structures 26 that is associated with one of the gate structures (i.e., the middle gate structure shown in FIG. 2A) of the plurality of gate structures 16. The opening may have a cylindrical shape.

Bottom electrode 30 is then formed into the opening present in the dielectric material layer 28. The bottom electrode 30 can be composed of a conductive material such as, for example, Ta, TaN, Ti, TiN, Ru, RuN, RuTa, RuTaN, Co, CoWP, CoN, W, WN or any combination thereof. The bottom electrode 30 can be formed by a deposition process such as, for example, sputtering, CVD, or PECVD. A planarization process such as, for example, CMP or grinding may follow the deposition of the conductive material that provides the bottom electrode 30.

Figure 3B:
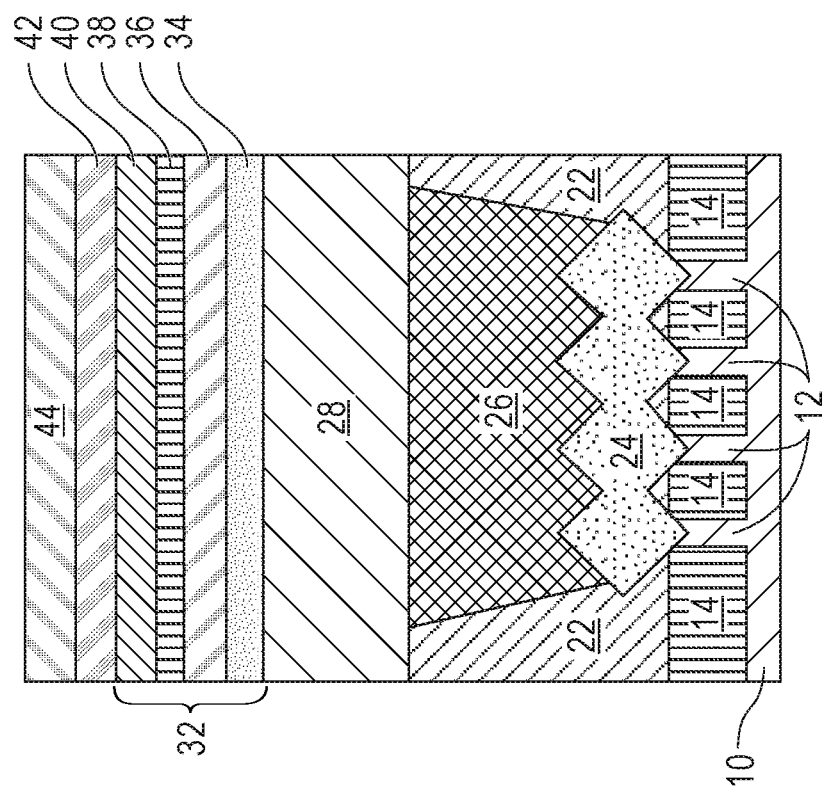
FIG. 3B is a Y-Y cross sectional view of the exemplary structure shown in FIG. 3A.
Figure 3A:
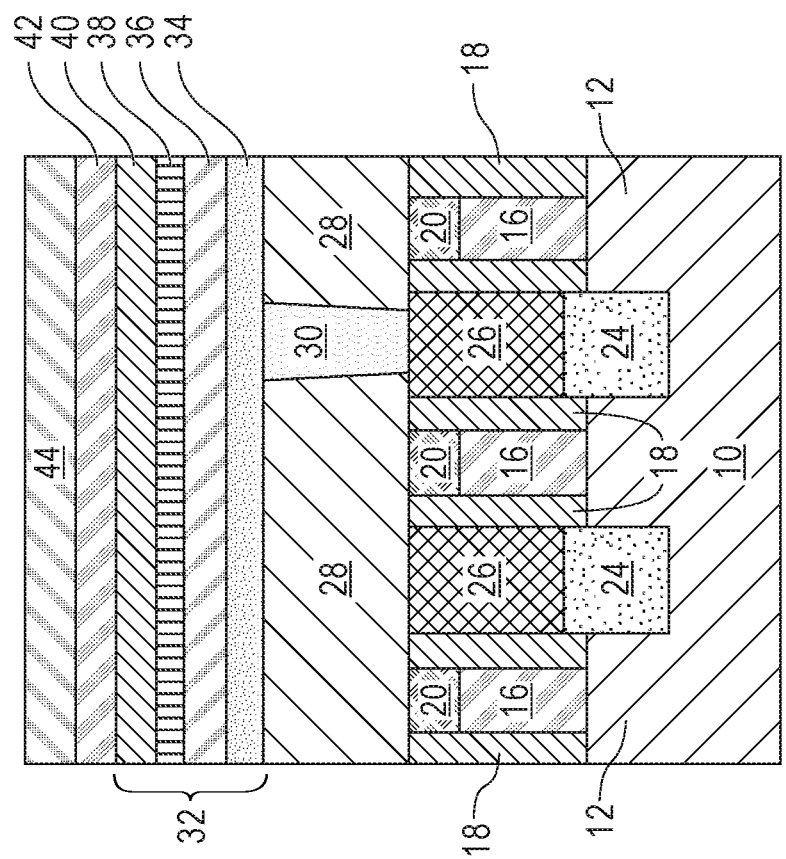
FIG. 3A is an X-X cross sectional view of the exemplary structure of FIG. 2A after forming a multilayered magnetic tunnel junction (MTJ) material stack on the dielectric material layer and the embedded bottom electrode, and a top electrode layer on the MTJ material stack.

Referring now to FIGS. 3A-3B, there are shown the exemplary structure of FIGS. 2A-2B after forming a multilayered magnetic tunnel junction (MTJ) material stack 32 on the dielectric material layer 28 and the embedded bottom electrode 30, and forming a top electrode layer 42 on the MTJ material stack 32. In some embodiments and as illustrated in FIGS. 3A-3B, a hard mask layer 44 can be formed onto the top electrode layer 42.

The MTJ material stack 32 includes at least a magnetic pinned layer, a tunnel barrier layer, and a magnetic free layer. In some embodiments and as shown in FIGS. 3A-3B, the MTJ material stack 32 is a bottom pinned MTJ material stack that includes, from bottom to top, a magnetic pinned layer 36, a tunnel barrier layer 38, and a magnetic free layer 40. Also, an optional metal seed layer 34 can also be present in the bottom pinned MTJ material stack. The bottom pinned MTJ material stack can include a non-magnetic spacer layer (not shown) located on the magnetic free layer 40, a second magnetic free layer (not shown) located on the non-magnetic spacer layer, and/or a MTJ cap layer (not shown) located on the magnetic free layer 40 or on the second magnetic free layer.

In other embodiments (not shown), the MTJ stack is a top pinned MTJ material stack that includes, from bottom to top, a magnetic free layer, a tunnel barrier layer, and a magnetic pinned layer; in this embodiment, the order of elements 36 and 40 are reversed from those shown in FIGS. 3A-3B. In such an embodiment, the top pinned MTJ material stack can also include an optional metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack 32 can be formed by utilizing one or more deposition processes such as, for example, sputtering, plasma enhanced atomic layer deposition (PEALD), PECVD or PVD.

The optional metal seed layer 34 can be composed of platinum (Pt), palladium (Pd), nickel (Ni), rhodium (Rh), iridium (Jr), rhenium (Re) or alloys and multilayers thereof. In one example, the optional metal seed layer 34 is composed of platinum (Pt).

The magnetic pinned layer 36 has a fixed magnetization. The magnetic pinned layer 36 can be composed of a metal or metal alloy (or a stack thereof) that includes one or more metals exhibiting high spin polarization. In alternative embodiments, exemplary metals for the formation of the magnetic pinned layer 36 include iron, nickel, cobalt, chromium, boron, or manganese. Exemplary metal alloys can include the metals exemplified by the above. In another embodiment, the magnetic pinned layer 36 can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer 36.

The tunnel barrier layer 38 is composed of an insulator material and is formed at such a thickness as to provide an appropriate tunneling resistance. Exemplary materials for the tunnel barrier layer 38 include magnesium oxide, aluminum oxide, and titanium oxide, or materials of higher electrical tunnel conductance, such as semiconductors or low-bandgap insulators.

The magnetic free layer 40 can be composed of a magnetic material (or a stack of magnetic materials) with a magnetization that can be changed in orientation relative to the magnetization orientation of the magnetic pinned layer 36. Exemplary magnetic materials for the magnetic free layer 40 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer 40. In one embodiment, the second magnetic free layer is composed of a same magnetic material as the magnetic free layer 40. In another embodiment, the second magnetic free layer is composed of a magnetic material that is compositionally different from the magnetic free layer 40.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer can have a thickness from 2 nm to 25 nm; other thicknesses are possible and can be used in the present application as the thickness of the MTJ cap layer.

The top electrode layer 42 can be composed of a conductive material such as, for example, Ta, TaN, Ti, TiN, Ru, RuN, RuTa, RuTaN, Co, CoWP, CoN, W, WN or any combination thereof. The conductive material that provides the top electrode layer 42 can be compositionally the same as, or compositionally different from, the conductive material that provides the bottom electrode 30. In the present application, the top electrode layer 42 can have a thickness that is from 100 nm to 500 nm; although other thicknesses are possible and can be used as the thickness of the top electrode layer 42. The top electrode layer 42 can be formed by a deposition process such as, for example, sputtering, PEALD, PECVD or PVD.

As mentioned above, a hard mask layer 44 can be formed on the top electrode layer 42. The hard mask layer 44 is composed of any hard mask material including, for example, silicon dioxide, silicon nitride and/or silicon oxynitride. The hard mask layer 44 can be formed utilizing a deposition process such as, for example, PEALD, PECVD or PVD. The hard mask layer 44 can have a thickness that is from 10 nm to 50 nm; although other thicknesses are possible and can be used as the thickness of the hard mask layer 44.

Figure 4A:
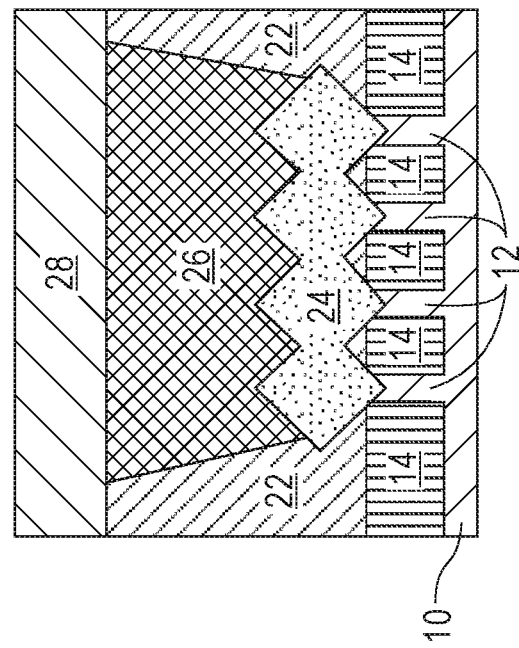
FIG. 4A is an X-X cross sectional view of the exemplary structure of FIG. 3A after patterning the top electrode layer and the MTJ material stack to provide a top electrode and a MTJ pillar, respectively, on at least the embedded bottom electrode.
Figure 4B:
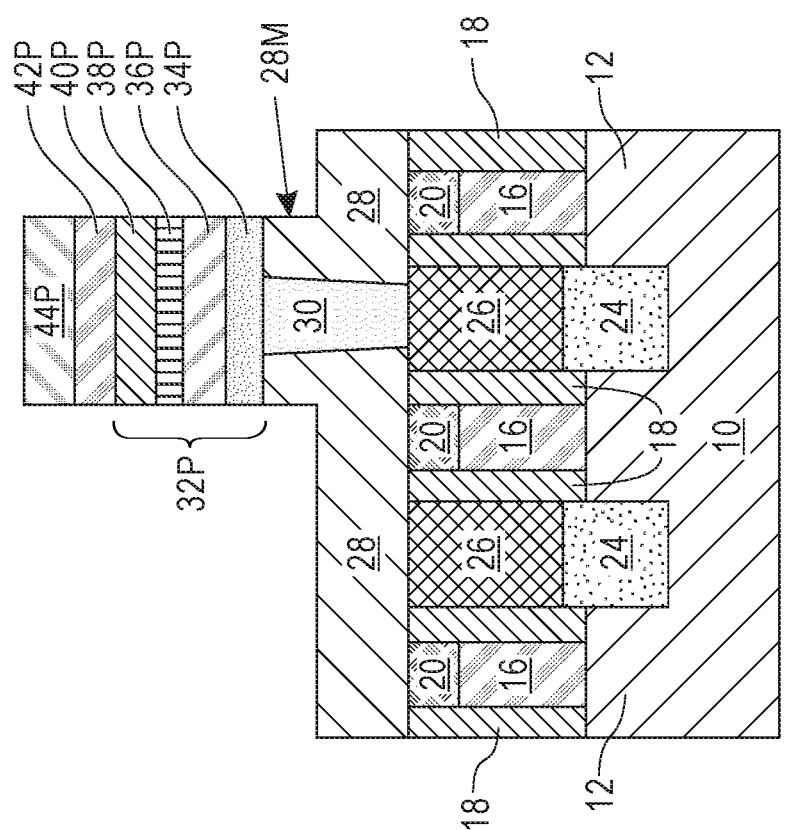
FIG. 4B is a Y-Y cross sectional view of the exemplary structure shown in FIG. 4A.

Referring now to FIGS. 4A-4B, there are shown the exemplary structure of FIGS. 3A-3B after patterning the top electrode layer 42 and the MTJ stack material 32 to provide a top electrode 42P and a MTJ pillar 32P, respectively, on at least the embedded bottom electrode 30. In embodiments in which a hard mask layer 44 is present, the hard mask layer 44 is patterned at this point of the present application to provide a hard mask 44P on the top electrode 42P.

The patterning of the optional hard mask layer 44, the top electrode layer 42 and the MTJ material stack 32 includes an ion beam etch (IBE) process. In some embodiments and as is shown in FIG. 4A, an upper portion of the dielectric material layer 28 is removed, i.e., recessed, during this patterning step. In such an embodiment, a mesa portion 28M of the dielectric material layer 28 is formed. The mesa portion 12M of the dielectric material layer 28 has a topmost surface that is located above the recessed portion of the dielectric material layer 28. In the present application, the dielectric material layer 28 including the mesa portion 12M is thicker than the recessed portion of the dielectric material layer 28. No damage to the underlying gate structures 16 and/or source/drain contact structures 26 occurs due to the thickness of the dielectric material layer 28. As illustrated in FIG. 4A, the MTJ pillar 32P is located on the mesa portion 28M of the dielectric material layer 28.

The remaining, i.e., non-patterned, portion of the MTJ material stack 32 provides MTJ pillar 32P. In one example and as shown in FIG. 4A, the MTJ pillar 32P is a bottom pinned MTJ structure that includes, from bottom to top, a metal seed layer portion 34P (i.e., a remaining unetched portion of the metal seed layer 34), a magnetic pinned layer portion 36P (i.e., a remaining, unetched portion of the magnetic pinned layer 36), a tunnel barrier layer portion 38P (i.e., a remaining, unetched portion of the tunnel barrier layer 38), and a magnetic free layer portion 40P (i.e., a remaining, unetched portion of the magnetic free layer 40). In another example (not shown), the MTJ pillar 32P is a top pinned MTJ structure that includes, from bottom to top, a magnetic free layer portion 40P, a tunnel barrier layer portion 38P, and a magnetic pinned layer portion 36P. In either embodiment (bottom pinned MTJ structure or top pinned MTJ structure), the MTJ pillar 32P can include remaining portions of any other layer that is present in the MTJ material stack 32.

The MTJ pillar 32P, top electrode 42P, and, if present, hard mask 44P can be cylindrical in shape; although other asymmetric shapes are possible and can be used in the present application as the shape of the MTJ pillar 32P, top electrode 42P, and, if present, hard mask 44P. In order to avoid unwanted resputtering of metal particles of the bottom electrode 30 onto the sidewall of the MTJ pillar 32P, the CD of the MTJ pillar 32P, top electrode 42P, and, if present, hard mask 44P is equal to, or greater than the CD of the bottom electrode 30.

Typically, the MTJ pillar 32P, top electrode 42P, and, if present, hard mask 44P have an outermost sidewall(s) that is(are) vertically aligned to each other. In embodiments in which the mesa portion 28M of the dielectric material layer 28 is formed, the MTJ pillar 32P, top electrode 42P, and, if present, hard mask 44P have an outermost sidewall(s) that is(are) vertically aligned the outermost sidewall(s) of the mesa portion 28M of the dielectric material layer 28.

Figure 5B:
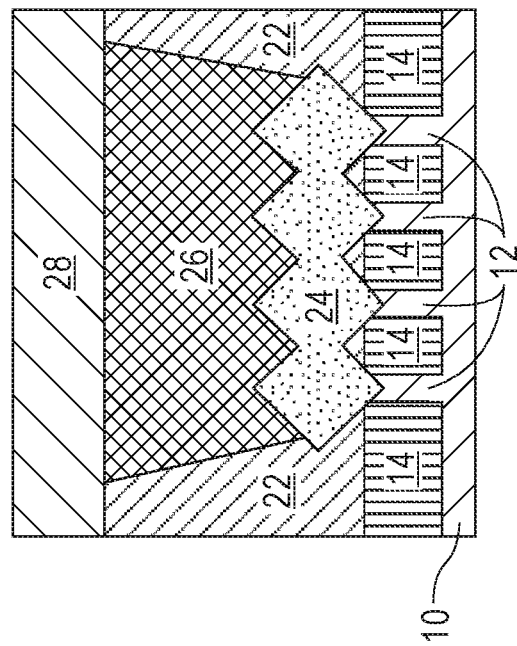
FIG. 5B is a Y-Y cross sectional view of the exemplary structure shown in FIG. 5A.
Figure 5A:
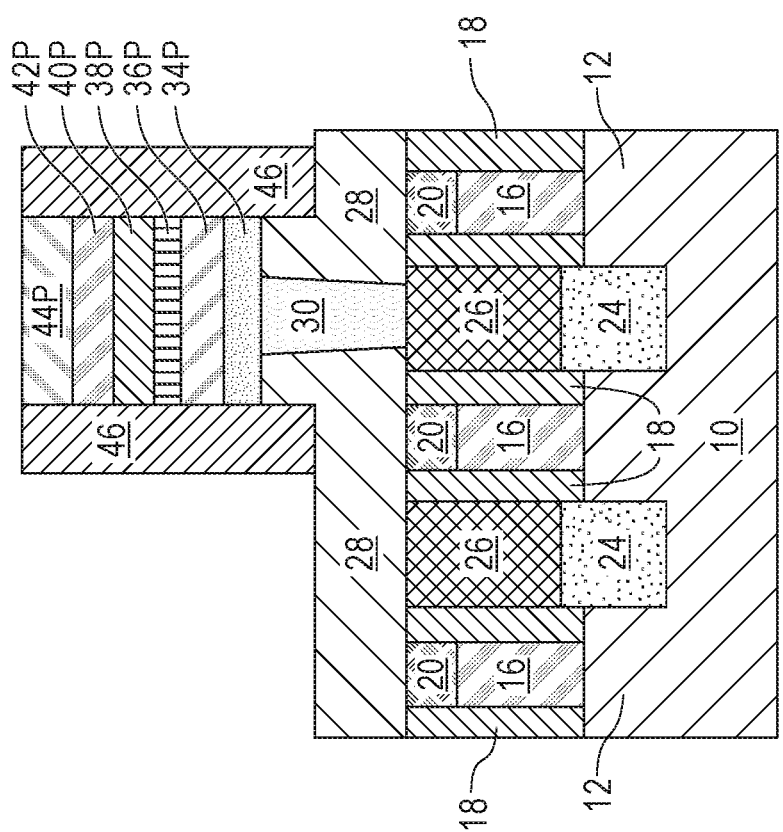
FIG. 5A is an X-X cross sectional view of the exemplary structure of FIG. 4A after forming a dielectric material spacer laterally adjacent to the MTJ pillar and the top electrode.

Referring now to FIGS. 5A-5B, there are shown the exemplary structure of FIGS. 4A-4B after forming a dielectric material spacer 46 laterally adjacent to the MTJ pillar 32P, the top electrode 42P and, if present, the hard mask 44P. The dielectric material spacer 46 encapsulates and encircles the MTJ pillar 32P, the top electrode 42P and, if present, the hard mask 44P. In some embodiments and as shown in FIG. 5A, a lower portion of the dielectric material spacer 46 is present along the sidewall of the mesa portion 28M of the dielectric material layer 28. In such an embodiment, the mesa portion 28M of the dielectric material layer 28 is encapsulated and encircled by the lower portion of the dielectric material spacer 46.

The dielectric material spacer 46 is composed of a dielectric material that is compositionally different from dielectric material layer 28 and hard mask layer 44. The dielectric material that provides the dielectric material spacer 46 may provide passivation to the MTJ pillar 32P and the top electrode 42P. In one embodiment, the dielectric material spacer 46 is composed of silicon nitride. In another embodiment, the dielectric material spacer 46 can be composed of a dielectric material that contains atoms of silicon, carbon and hydrogen. In some embodiments, and in addition to atoms of carbon and hydrogen, the dielectric material spacer 46 can include atoms of at least one of nitrogen and oxygen. In other embodiments, and in addition to atoms of silicon, nitrogen, carbon and hydrogen, the dielectric material spacer 46 can include atoms of boron. In one example, the dielectric material spacer 46 can be composed of an nBLOK dielectric material that contains atoms of silicon, carbon, hydrogen, nitrogen and oxygen. In an alternative example, the dielectric material spacer 46 can be composed of a SiBCN dielectric material that contains atoms of silicon, boron, carbon, hydrogen, and nitrogen.

The dielectric material spacer 46 can be formed by deposition such as, for example, CVD or PECVD, followed by a spacer etch such as, for example, a reactive ion etch (RIE). The dielectric material spacer 46 can have a topmost surface that is coplanar with either a topmost surface of the hard mask 44P, or a topmost surface of the top electrode 42P, if the hard mask 44P is omitted.

Referring now to FIGS. 6A-6B, there are shown the exemplary structure of FIGS. 5A-5B after forming an organic planarization layer (OPL) 50 that has a contact opening 52 formed therein that physically exposes a surface of another of the source/drain contact structures 26 of the first gate structure (i.e., the middle gate structure shown in FIG. 6A). In the present application, the bottom electrode 30 contacts a source/drain contact structure 26 that is located on one side of the gate structure 16, and the contact opening 52 physically exposes a source/drain contact structure 26 that is located on an opposite side of the same gate structure 16.

The OPL 50 can be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB. The OPL can be formed utilizing a deposition process such as, for example, CVD, PECVD or spin-on coating. The OPL 50 has a height that extends above the topmost surface of the hard mask 44P or, if the hard mask 44P is omitted, above the topmost surface of the top electrode 42P.

The contact opening 52 can be formed by lithography and etching. Due to the difference in etch selectivity between the OPL 50 and the dielectric material layer 28, the contact opening 52 that is present in the dielectric material layer 28 may have tapered sidewalls (i.e., inward tapered sidewalls as measured from top to bottom) as shown in FIGS. 6A and 6B. In some embodiments, the contact opening 52 is located in a recessed portion of the dielectric material layer 28 that is located laterally adjacent to the mesa portion 28M of the dielectric material layer 28 which embeds the bottom electrode 30.

Figure 7A:
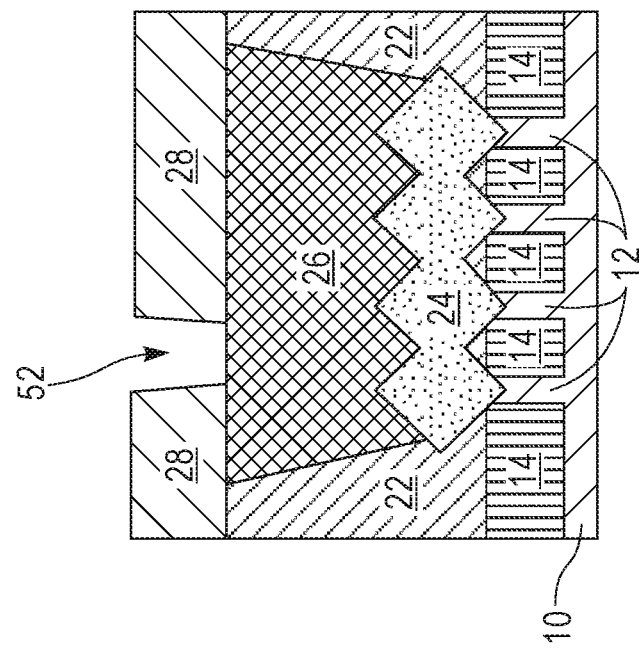
FIG. 7A is an X-X cross sectional view of the exemplary structure of FIG. 6A after removing the OPL.
Figure 7B:
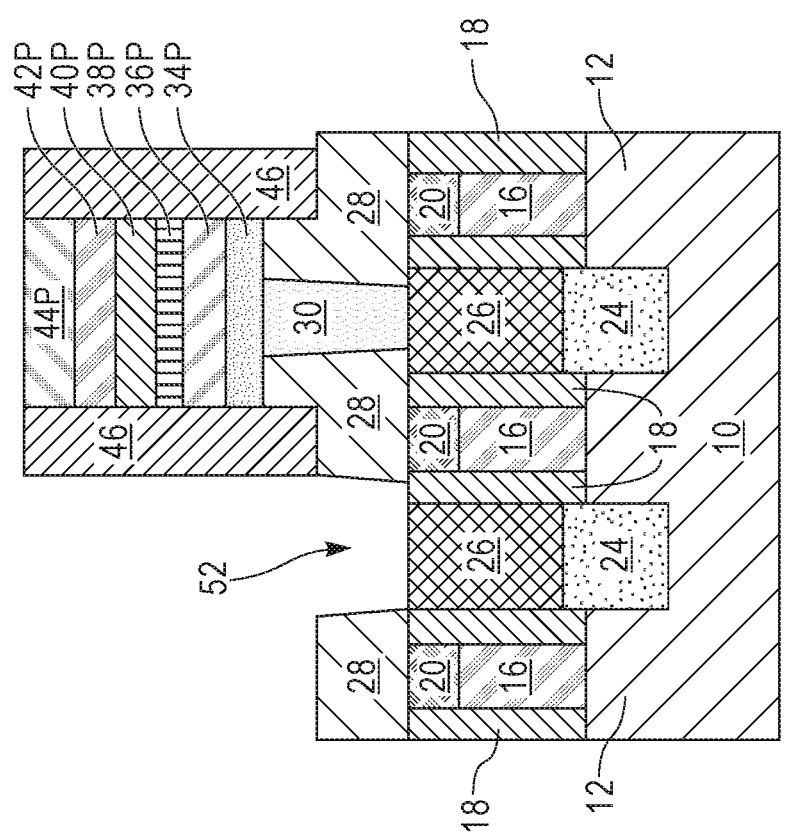
FIG. 7B is a Y-Y cross sectional view of the exemplary structure shown in FIG. 7A.

Referring now to FIGS. 7A-7B, there are shown the exemplary structure of FIGS. 6A-6B after removing the OPL 50. The OPL layer 50 can be removed utilizing any material removal process such as, for example, ashing.

Referring now to FIGS. 8A-8B, there are shown the exemplary structure of FIGS. 7A-7B after forming a conductive metal-containing layer 54 and a contact metal-containing layer 56. In some embodiments, conductive metal-containing layer 54 can be omitted.

Conductive metal-containing layer 54 is a continuous layer that is formed on all physically exposed surfaces of the exemplary structure shown in FIGS. 7A-7B including within the contact opening 52 that is formed in the dielectric material layer 28. The conductive metal-containing layer 54 is composed of a conductive liner material such as, for example, Ta, TaN, Ti, TiN, Ru, RuN, RuTa, RuTaN, W, or WN. In some embodiments, the conductive metal-containing layer 54 can include a material stack of conductive liner materials. In one example, the conductive liner material can be composed of a stack of Ta/TaN. The conductive metal-containing layer 54 can be formed utilizing a deposition process such as, for example, CVD, PECVD, PVD, or sputtering. The conductive metal-containing layer 54 can have a thickness from 1 nm to 15 nm; although other thicknesses for the conductive metal-containing layer 54 are possible and can be used as the thickness of the conductive metal-containing layer 54 in the present application.

The contact metal-containing layer 56 includes any contact metal or contact metal alloy that is subtractive etch friendly. Examples of such subtractive etch friendly materials include, but are not limited to, ruthenium (Ru), aluminum (Al) or palladium (Pd). Typically, the contact metal-containing layer 56 is compositionally different from the conductive metal-containing layer 54. The contact metal-containing layer 56 can be formed utilizing a deposition process such as, for example, CVD, PECVD, plating, or sputtering. The contact metal-containing layer 56 is a continuous layer that is present on an entirety of the conductive metal-containing layer 54. In embodiments in which the conductive metal-containing layer 54 is omitted, the contact metal-containing layer 56 is a continuous layer that is formed on all physically exposed surfaces of the exemplary structure shown in FIGS. 7A-7B including within the contact opening 52 that is formed in the dielectric material layer 28. As is shown, a lower portion of the contact metal-containing layer 56 is present in contact opening 52 that is present in the dielectric material layer 28, which also includes bottom electrode 30. The lower portion of the contact metal-containing layer 56 that is present in the contact opening 52 may have inward tapered sidewalls as mentioned above.

Referring now to FIGS. 9A-9B, there are shown the exemplary structure of FIGS. 8A-8B after recessing both the contact metal-containing layer 56 and the conductive metal-containing layer 54; if the conductive metal-containing layer 54 is omitted only the contact metal-containing layer 56 is recessed. The recessing can include first planarizing the contact metal-containing layer 56 and then performing a recess etch. The remaining contact metal-containing layer 56 can be referred as a recessed contact metal-containing layer 56R, and the remaining conductive metal-containing layer 54 can be referred as a recessed conductive metal-containing layer 54R. The recessed contact metal-containing layer 56R and the recessed conductive metal-containing layer 54R have topmost surfaces that are coplanar with each other. The topmost surfaces of the recessed contact metal-containing layer 56R and the recessed conductive metal-containing layer 45R are located below the topmost surface of at least the top electrode 42P.

Referring now to FIGS. 10A-10B, there are shown the exemplary structure of FIGS. 9A-9B after forming a hard mask cap 58 on the recessed contact metal-containing layer 56R and the recessed conductive metal-containing layer 54R. The hard mask cap 58 includes any hard mask material and is compositionally different from the hard mask 44P that is present on the top electrode 42P and the dielectric material spacer 46. The hard mask cap 58 can be formed by a deposition process, followed by a planarization process such as, for example, CMP. The hard mask cap 58 has a topmost surface that is typically coplanar with a topmost surface of the dielectric material spacer 46.

Referring now to FIGS. 11A-11B, there are shown the exemplary structure of FIGS. 10A-10B after forming another OPL 60P, and then patterning the another OPL 60P, the hard mask 58, the recessed contact metal-containing layer 56R and the recessed conductive metal-containing layer 54R that are present in the source/drain region (i.e., along cross section Y-Y as shown in FIG. 11B). The another OPL 60P can be composed of one of the materials mentioned above for OPL 50, and OPL 60P can be formed utilizing one of the deposition processes mentioned above for forming OPL 50.

Patterning can be performed by lithography and etching. Each remaining (i.e., non etched) portion of the hard mask 58 can be referred to as a patterned hard mask cap 58P, each remaining (i.e., non-etched) portion of the recessed contact metal-containing layer 56R can be referred to as a lower contact structure 56S, and each remaining (i.e., non-etched) portion of the recessed conductive metal-containing layer 54R can be referred to herein as a conductive metal-containing liner 54L. In FIG. 12B, the lower structure 56S that is not present in the contact opening 52 that is present in the dielectric material layer 28 represents a dummy structure and is not employed for electrical connection in the present application. As can be seen in FIG. 12B, the patterned structure including the patterned hard mask cap 58P and the lower contact structure 56S can have a tapered sidewall (in this case the tapering is outward from top to bottom).

In FIG. 11A, a lower portion of the lower contact structure 56S that is present in the contact opening 52, and the entirety of the bottom electrode 30 are located in dielectric material layer 28. Notably, the bottom electrode 30 is located entirely within the dielectric material layer 28 that includes mesa portion 28M, while the lower portion of the lower contact structure 56S that is present in the contact opening 52 is located entirely in the recessed portion of the dielectric material layer 38; dielectric material layer 28 including the mesa portion 28M has a height (i.e., vertical thickness) that is greater than the recessed portion of the dielectric material layer 28.

Referring now to FIGS. 12A-1B, there are shown the exemplary structure of FIGS. 11A-11B after removing the another OPL 60P. The another OPL 60P can be removed utilizing any material removal process such as, for example, ashing.

Referring now to FIGS. 13A-13B, there are shown the exemplary structure of FIGS. 12A-12B after forming a low-k dielectric fill material 62, and planarizing the low-dielectric fill material 62. The term "low-k" has the meaning defined above, i.e., a dielectric material that has a dielectric constant of less than 4.0. In some embodiments, the low-k dielectric fill material 62 includes a Si-based dielectric material. The Si-based dielectric materials can be either silica-based (e.g., SiOCH) or silsesquioxane (SSQ)-based (e.g., hydrogen-SSQ or methyl-SSQ). Other low-k dielectrics such as, for example, non-Si based dielectric materials (i.e., polymers or amorphous carbon) can be used as low-k dielectric fill material 62. The low-k dielectric fill material 62 can be formed utilizing a deposition process such as, for example, CVD, PECVD or spin-on coating. Planarization of the deposited low-k dielectric fill material 62 can be performed by CMP of grinding. After planarization, the low-k dielectric fill material 62 has topmost surface that is coplanar with a topmost surface of each patterned hard mask cap 58P. The dielectric fill material 62 and the dielectric material layer 28 are present in the MOL.

Referring now to FIGS. 14A-14B, there are shown the exemplary structure of FIGS. 13A-13B after forming a BEOL dielectric material layer 64 having upper contact structures (66X, 66Y) formed therein. The BEOL dielectric material layer 64 may include one of the dielectric materials mentioned above for dielectric material layer 28. The BEOL dielectric material layer 64 can be formed utilizing a deposition process such as, for example, CVD, PECVD or spin-on coating.

The upper contact structures (66X, 66Y) are formed by forming a pair of contact openings into the BEOL dielectric material layer 64, wherein one of the contact openings extends to the surface of the lower contact structure 56S that contacts the source/drain structure 26, while the other contact opening extends to the surface of the top electrode 44P. The pair of contact openings can be formed by lithography and etching. Each contact opening is then filled with a contact metal or contact metal alloy. Exemplary contact metals include copper, aluminum or tungsten. An exemplary contact metal alloy is a copper aluminum alloy.

As is shown, first upper contact structure 66X contacts a surface of the lower contact structure 56S which, in turn, contacts a surface of one of the source/drain contact structure 26, while second upper contact structure 66Y contacts a surface of the top electrode 42P that is located on the MTJ pillar 32P.

FIGS. 14A-14B illustrates a memory cell (i.e., 1T1M) in accordance with the present application. The memory cell includes a FEOL that includes a gate structure (middle gate structure 16) straddling over a semiconductor fin 12, wherein a source/drain structure 24 is located on each side of the gate structure 16, and a source/drain contact structure 26 is located on each source/drain structure 24. A MOL level is located above the FEOL level and includes a MRAM device (including bottom electrode 30, MTJ pillar 32P, and top electrode 42P) and a lower contact structure 56S, wherein a bottom electrode 30 of the MRAM device contacts one of the source/drain contact structures (i.e., the source/drain contact structure 26 to the right of the middle gate structure 16) located on one side of the gate structure 16, and the lower contact structure 56S contacts another of the source/drain contact structures (i.e., the source/drain contact structure 26 to the left of the middle gate structure 16) located on another side of the gate structure 16. A BEOL level is located above the MOL level and includes a first upper contact structure 66X contacting a surface of the lower contact structure 56S, and a second upper contact structure 66Y contacting a surface of a top electrode 42P of the MRAM device. Such a memory cell has low wiring resistance and hence fast memory speed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory cell comprising:
    a front-end-of-the-line (FEOL) level comprising a gate structure straddling over a semiconductor fin, wherein a source/drain structure is located on each side of the gate structure, and a source/drain contact structure is located on each source/drain structure;
    a middle-of-the-line (MOL) level located above the FEOL and comprising a magnetoresistive random access memory (MRAM) device and a lower contact structure, wherein a bottom electrode of the MRAM device contacts one of the source/drain contact structures located on one side of the gate structure, and the lower contact structure contacts another of the source/drain contact structures located on another side of the gate structure; and
    a back-end-of-line (BEOL) level located above the MOL level and comprising a first upper contact structure contacting a surface of the lower contact structure, and a second upper contact structure contacting a surface of a top electrode of the MRAM device, wherein the MOL level further comprises a dielectric material layer having a mesa portion and a recessed portion, and wherein a lower portion of the lower contact structure is embedded in the recessed portion of the dielectric material layer, and the bottom electrode is embedded in an area of the dielectric material layer including the mesa portion.

2. The memory cell of claim 1, wherein the MRAM device further comprises a magnetic tunnel junction (MTJ) pillar contacting the bottom electrode, wherein the MTJ pillar is located on the mesa portion of the dielectric material layer.

3. The memory cell of claim 2, further comprising a dielectric material spacer encapsulating and encircling the MTJ pillar and the top electrode, wherein a portion of the dielectric material spacer contacts a sidewall of the mesa portion of the dielectric material layer.

4. The memory cell of claim 2, wherein the MTJ pillar is a bottom pinned MTJ structure.

5. The memory cell of claim 2, wherein the MTJ pillar is a top pinned MTJ structure.

6. The memory of claim 2, wherein both the MTJ pillar and the top electrode have a first critical dimension, and wherein the bottom electrode has a second critical dimension that is less than the first critical dimension.

7. The memory cell of claim 2, wherein both the MTJ pillar and the top electrode are cylindrical in shape.

8. The memory cell of claim 1, wherein a lower portion of the lower contact structure has tapered sidewalls.

9. The memory cell of claim 1, wherein the first upper contact structure and the second upper contact structure are partially located in a BEOL dielectric material layer that is located above the MOL level.

10. A memory cell comprising:
    a front-end-of-the-line (FEOL) level comprising a gate structure straddling over a semiconductor fin, wherein a source/drain structure is located on each side of the gate structure, and a source/drain contact structure is located on each source/drain structure;
    a middle-of-the-line (MOL) level located above the FEOL and comprising a magnetoresistive random access memory (MRAM) device and a lower contact structure, wherein a bottom electrode of the MRAM device contacts one of the source/drain contact structures located on one side of the gate structure, and the lower contact structure contacts another of the source/drain contact structures located on another side of the gate structure;
    a back-end-of-line (BEOL) level located above the MOL level and comprising a first upper contact structure contacting a surface of the lower contact structure, and a second upper contact structure contacting a surface of a top electrode of the MRAM device, and a conductive metal-containing liner located between the lower contact structure and the another source/drain structure that is located on the another side of the gate structure, wherein the conductive metal-containing liner has a topmost surface that is coplanar with a topmost surface of the lower contact structure.

11. The memory cell of claim 10, wherein the MOL level further comprises a dielectric material layer having a mesa portion and a recessed portion, and wherein a lower portion of the lower contact structure is embedded in the recessed portion of the dielectric material layer, and the bottom electrode is embedded in an area of the dielectric material layer including the mesa portion.

12. The memory cell of claim 10, wherein the topmost surface of the conductive metal-containing liner is located beneath a topmost surface of the top electrode of the MRAM device.

13. A method of forming a memory cell, the method comprising:

forming a front-end-of-the-line (FEOL) level comprising a gate structure straddling over a semiconductor fin, wherein a source/drain structure is located on each side of the gate structure, and a source/drain contact structure is located on each source/drain structure;

forming a dielectric material layer of a middle-of-the-line (MOL) level over the FEOL level;

forming a bottom electrode of a magnetoresistive random access memory (MRAM) device in the dielectric material layer and contacting one of the source/drain contact structures located on one side of the gate structure;

forming a magnetic tunnel junction (MTJ) pillar and a top electrode of the MRAM device above the bottom electrode;

forming a lower contact structure contacting another of the source/drain contact structures located on another side of the gate structure, wherein a lower portion of the lower contact structure is embedded in the dielectric material layer; and forming a back-end-of-line (BEOL) level above the MOL level and comprising a first upper contact structure contacting a surface of the lower contact structure, and a second upper contact structure contacting a surface of the top electrode of the MRAM device, wherein the forming of the MTJ pillar and the top electrode comprises forming a MTJ material stack and a top electrode layer, and patterning the MTJ material stack and the top electrode layer utilizing an ion beam etch, wherein, during the ion beam etch, a portion of the dielectric material layer that is located laterally adjacent to the bottom electrode is recessed, and the lower portion of the lower contact structure is embedded in the recessed portion of the dielectric material layer.

14. The method of claim 13, further comprising forming a dielectric material spacer encapsulating and encircling the MTJ pillar and the top electrode.

15. The method of claim 13, wherein the forming of the lower contact structure comprises:

forming a contact opening in the dielectric material layer that physically exposes a surface of the another of the source/drain contact structures located on the another side of the gate structure;

forming a conductive metal-containing layer on the dielectric material layer including within the contact opening and along a sidewall wall and above a topmost of the top electrode;

forming a contact metal-containing layer on the conductive metal-containing layer;

recessing the contact metal-containing layer and the conductive metal-containing layer to a height that is below a height of the top electrode;

forming a hard mask cap above the recessed contact metal-containing layer; and patterning the hard mask cap, the recessed contact metal-containing layer and the recessed conductive metal-containing layer that are located in the another side of the gate structure.

16. The method of claim 15, wherein the contact opening has tapered sidewalls, and wherein the lower portion of the lower contact structure that is embedded in the dielectric material layer has tapered sidewalls.

17. The method of claim 13, wherein the MTJ pillar is a bottom pinned MTJ structure.

18. The method of claim 13, wherein the MTJ pillar is a top pinned MTJ structure.

* * * * *